United States Patent
Yang et al.

(10) Patent No.: US 12,261,158 B2
(45) Date of Patent: Mar. 25, 2025

(54) DISPLAY PANEL WITH LIGHT-SHIELDING LAYER AND DISPLAY DEVICE INCLUDING SAME

(71) Applicant: WUHAN CHINA STAR OPTOELECTRONICS SEMICONDUCTOR DISPLAY TECHNOLOGY CO., LTD., Hubei (CN)

(72) Inventors: Cheng Yang, Hubei (CN); Pan Jiang, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 17/605,507

(22) PCT Filed: Sep. 3, 2021

(86) PCT No.: PCT/CN2021/116430
§ 371 (c)(1),
(2) Date: Oct. 21, 2021

(87) PCT Pub. No.: WO2023/015630
PCT Pub. Date: Feb. 16, 2023

(65) Prior Publication Data
US 2024/0030203 A1     Jan. 25, 2024

(30) Foreign Application Priority Data
Aug. 11, 2021  (CN) .......................... 202110919585.7

(51) Int. Cl.
*H01L 25/16*     (2023.01)
*H01L 25/075*    (2006.01)
(Continued)

(52) U.S. Cl.
CPC ........ *H01L 25/167* (2013.01); *H01L 25/0753* (2013.01); *H01L 33/10* (2013.01); *H01L 33/62* (2013.01)

(58) Field of Classification Search
CPC .......................... H10K 59/126; H10K 50/865
See application file for complete search history.

(56) References Cited

U.S. PATENT DOCUMENTS

2021/0175303 A1   6/2021   Bang et al.
2021/0249494 A1*  8/2021   You ................... H10K 59/1213
(Continued)

FOREIGN PATENT DOCUMENTS

CN   108550606 A   9/2018
CN   208889658 U   5/2019
(Continued)

OTHER PUBLICATIONS

International Search Report in International application No. PCT/CN2021/116430, mailed on May 6, 2022.
(Continued)

*Primary Examiner* — Lex H Malsawma
*Assistant Examiner* — Bruce R. Smith (57) ABSTRACT

The present application discloses a display panel and a display device. The display panel includes substrate, a plurality of pixel driving circuits, and a light-shielding layer. By disposing the light-shielding layer in a transition display region of the display panel, disposing the light-shielding layer between the substrate and an active layer of each of transistors of the pixel driving circuits, and configuring an orthographic projection of light-shielding portions on the substrate to cover an orthographic projection of overlapping portions on the substrate, the light-shielding layer can shield (Continued)

infrared light emitted by the transmitting sensor, thereby preventing the transistors from an interference of the infrared light.

16 Claims, 5 Drawing Sheets

(51) Int. Cl.
*H01L 33/10* (2010.01)
*H01L 33/62* (2010.01)

(56) References Cited

U.S. PATENT DOCUMENTS

| | | | |
|---|---|---|---|
| 2021/0257594 A1* | 8/2021 | Kim | H10K 59/126 |
| 2022/0130913 A1* | 4/2022 | Long | H10K 59/131 |
| 2022/0238612 A1* | 7/2022 | Shi | H10K 59/126 |

FOREIGN PATENT DOCUMENTS

| | | | | |
|---|---|---|---|---|
| CN | 110061014 A | | 7/2019 | |
| CN | 110289296 A | | 9/2019 | |
| CN | 111490081 A | | 8/2020 | |
| CN | 112909020 A | | 6/2021 | |
| CN | 112928225 A | * | 6/2021 | ......... H01L 27/3227 |
| CN | 213342306 U | | 6/2021 | |

OTHER PUBLICATIONS

Written Opinion of the International Search Authority in International application No. PCT/CN2021/116430, mailed on May 6, 2022.

Chinese Office Action issued in corresponding Chinese Patent Application No. 202110919585.7 dated Apr. 14, 2023, pp. 1-7.

* cited by examiner

DISPLAY PANEL WITH LIGHT-SHIELDING LAYER AND DISPLAY DEVICE INCLUDING SAME

FIELD OF INVENTION

The present application is related to the field of display technology and specifically to a display panel and a display device.

BACKGROUND OF INVENTION

Time-of-flight (TOF) is a technology that uses a flight time of light to measure distance. TOF has been widely used in a field of face recognition in smart phones. Compared with 3D structured light, TOF has advantages of a long detection distance and a simple structure.

Camera-under-panel (CUP) technology equipped with TOF technology is realized by placing a transmitter and a receiver of a TOF camera under two under-screen camera regions. However, the TOF camera obtains depth information by emitting and receiving infrared light emitted by an infrared laser light source. As a result, in an actual application, the infrared light emitted by the transmitter of the TOF camera will interfere with transistors above the TOF camera, which causes a screen corresponding to the under-screen camera regions to flicker, thereby affecting a display effect of these regions.

SUMMARY OF INVENTION

The present application provides a display panel and a display device to solve a technical problem in under-screen camera regions of a current display panel that a screen corresponding to the under-screen camera regions flickers caused by an interference between infrared light emitted by transmitting sensor of a TOF camera and transistors above the TOF camera.

In order to solve the above problem, the present application provides the following technical solutions.

The present application provides a display panel. The display panel includes a main display region and at least one function adding region. The function adding region is configured to accommodate a transmitting sensor and a receiving sensor of an optical sensing unit. The function adding region includes at least one light-transmitting display region and a transition display region positioned on a periphery of the light-transmitting display region. The display panel further includes:

a substrate;

a plurality of pixel driving circuits disposed on the substrate and positioned in the transition display region, wherein each of the pixel driving circuit includes a plurality of transistors, each of the transistors includes an active layer and a first electrode layer disposed on the active layer, and an orthographic projection of the active layer on the substrate and an orthographic projection of the first electrode layer on the substrate includes an overlapping portion; and a light-shielding layer disposed between the substrate and the pixel driving circuits and positioned in the transition display region, wherein an orthographic projection of the light-shielding layer on the substrate covers an orthographic projection of the overlapping portion on the substrate, a size of the light-shielding layer on a thickness direction of the display panel is greater than or equal to 100 nanometers, and a material of the light-shielding layer includes one or a combination of titanium (Ti), aluminum (Al), and molybdenum (Mo) alloys.

According to the display panel provided by the present application, the light-shielding layer includes a plurality of light-shielding portions arranged at intervals. The light-shielding portions one-to-one correspond to a plurality of the overlapping portions. An orthographic projection of each of the light-shielding portions on the substrate covers an orthographic projection of a corresponding one of the overlapping portions on the substrate.

According to the display panel provided by the present application, an orthographic projection of one of the light-shielding portions on the substrate coincides with an orthographic projection of a corresponding first electrode layer on the substrate.

According to the display panel provided by the present application, an orthographic projection of one of the light-shielding portions on the substrate coincides with an orthographic projection of a corresponding active layer on the substrate.

According to the display panel provided by the present application, the light-shielding layer further includes a plurality of connecting portions. Every two adjacent light-shielding portions are connected by one of the connecting portions to form a metal grid.

According to the display panel provided by the present application, the display panel further includes a non-display region on a periphery of the main display region. The substrate in the non-display region is provided with a bias voltage signal line. The metal grid is electrically connected to the bias voltage signal line.

According to the display panel provided by the present application, a side of the light-shielding layer adjacent to the substrate is provided with a reflective layer.

According to the display panel provided by the present application, the display panel further includes first light-emitting devices and second light-emitting devices. The first light-emitting devices are positioned in the light-transmitting display region. The second light-emitting devices are positioned in the transition display region.

The pixel driving circuits includes a plurality of first pixel driving circuits and a plurality of second pixel driving circuits. The first pixel driving circuits are electrically connected to the first light-emitting devices to drive the first light-emitting devices to emit light. The second pixel driving circuits are electrically connected to the second light-emitting devices to drive the second light-emitting devices to emit light.

The present application provides a display panel. The display panel includes a main display region and at least one function adding region. The function adding region is configured to accommodate a transmitting sensor and a receiving sensor of an optical sensing unit. The function adding region includes at least one light-transmitting display region and a transition display region positioned on a periphery of the light-transmitting display region. The display panel further includes:

a substrate;

a plurality of pixel driving circuits disposed on the substrate and positioned in the transition display region, wherein each of the pixel driving circuit includes a plurality of transistors, each of the transistors includes an active layer and a first electrode layer disposed on the active layer, and an orthographic projection of the active layer on the substrate and an orthographic projection of the first electrode layer on the substrate includes an overlapping portion; and a light-shielding layer disposed between the substrate and the pixel driving circuits and positioned in the transition display region, wherein an orthographic projection of the light-shielding layer on the substrate covers an orthographic projection of the overlapping portion on the substrate.

According to the display panel provided by the present application, the light-shielding layer includes a plurality of light-shielding portions arranged at intervals. The light-shielding portions one-to-one correspond to a plurality of the overlapping portions. An orthographic projection of each of the light-shielding portions on the substrate covers an orthographic projection of a corresponding one of the overlapping portions on the substrate.

According to the display panel provided by the present application, an orthographic projection of one of the light-shielding portions on the substrate coincides with an orthographic projection of a corresponding first electrode layer on the substrate.

According to the display panel provided by the present application, an orthographic projection of one of the light-shielding portions on the substrate coincides with an orthographic projection of a corresponding active layer on the substrate.

According to the display panel provided by the present application, the light-shielding layer further includes a plurality of connecting portions. Every two adjacent light-shielding portions are connected by one of the connecting portions to form a metal grid.

According to the display panel provided by the present application, the display panel further includes a non-display region on a periphery of the main display region. The substrate in the non-display region is provided with a bias voltage signal line. The metal grid is electrically connected to the bias voltage signal line.

According to the display panel provided by the present application, a side of the light-shielding layer adjacent to the substrate is provided with a reflective layer.

According to the display panel provided by the present application, a size of the light-shielding layer on a thickness direction of the display panel is greater than or equal to 100 nanometers.

According to the display panel provided by the present application, a material of the light-shielding layer includes one or a combination of titanium (Ti), aluminum (Al), and molybdenum (Mo) alloys.

According to the display panel provided by the present application, the display panel further includes first light-emitting devices and second light-emitting devices. The first light-emitting devices are positioned in the light-transmitting display region. The second light-emitting devices are positioned in the transition display region.

The pixel driving circuits includes a plurality of first pixel driving circuits and a plurality of second pixel driving circuits. The first pixel driving circuits are electrically connected to the first light-emitting devices to drive the first light-emitting devices to emit light. The second pixel driving circuits are electrically connected to the second light-emitting devices to drive the second light-emitting devices to emit light.

According to the display panel provided by the present application, the display panel further includes:

a buffer layer disposed between the substrate and the light-shielding layer;

a first insulating layer covering the buffer layer and the light-shielding layer, wherein the active layer is disposed on a side of the first insulating layer away from the substrate;

a second insulating layer covering the first insulating layer and the active layer, wherein the first electrode layer is disposed on the side of the first insulating layer away from the substrate;

a third insulating layer covering the second insulating layer and the first electrode layer;

a second electrode layer disposed on the third insulating layer;

a fourth insulating layer covering the third insulating layer and the second electrode layer; and a source/drain metal layer disposed on the fourth insulating layer and including a source and a drain, wherein the source and the drain are respectively connected to the active layer through through-holes penetrating the second insulating layer, the third insulating layer, and the fourth insulating layer.

The present application provides a display device, including the above display panel; and the optical sensing unit disposed on a side of the display panel and including the transmitting sensor and the receiving sensor, wherein transmitting sensor and the receiving sensor are correspond to the function adding region, and light emitted by the transmitting sensor is received by the receiving sensor after being reflected.

Beneficial effects of the present application are as follows. In the display panel and the display device provided by the present application, the light-shielding layer is positioned in the transition display region of the display panel, the light-shielding layer is disposed between the substrate and the active layer of each of the transistors of the pixel driving circuits, the orthographic projection of the active layer on the substrate and the orthographic projection of the first electrode layer on the substrate includes the overlapping portion, and the orthographic projection of the light-shielding portions on the substrate covers the orthographic projection of the overlapping portions on the substrate. Therefore, the light-shielding layer can effectively shield infrared light emitted by the transmitting sensor of the optical sensing unit, which prevents devices of the transistors in the transition display region from an interference of the infrared light, thereby preventing under-screen camera regions from flickering.

DESCRIPTION OF DRAWINGS

In order to describe technical solutions in the present application or prior art clearly, drawings to be used in the description of embodiments will be described briefly below. Obviously, drawings described below are only for some embodiments of the present application, and other drawings can be obtained by those skilled in the art based on these drawings without creative efforts.

REFERENCE SIGNS

100a: main display region, 100b: function adding region, 100c: light-transmitting display region, 100d: transition display region, 100e: non-display region,
1: substrate, 2: pixel driving circuit, 3: light-shielding layer, 4: reflective layer, 5: planarization layer, 7: encapsulating layer, 8: transparent conductive layer, 9: wiring insulating layer, 10: buffer layer, 11: first insulating layer, 12: second insulating layer, 13: third insulating layer, 14: second electrode layer, 15: fourth insulating layer, 16: source/drain metal layer,
201: first pixel driving circuit, 202: second pixel driving circuit, 21: transistor, 210: active layer, 2101: overlapping portion, 211: first electrode, 212: bias voltage signal line,
31: light-shielding portion, 32: connecting portion, 33: repeat unit, 34: hollow portion,
61: first light-emitting device, 611: first anode, 612: first light-emitting layer, 613: first cathode, 62: second light-emitting device, 621: second anode, 622: second light-emitting layer, 623: second cathode, and
81: connecting wire.

DETAILED DESCRIPTION OF EMBODIMENTS

The technical solution of the present application embodiment will be clarified and completely described with reference accompanying drawings in embodiments of the present application embodiment. Obviously, the present application described parts of embodiments instead of all of the embodiments. Based on the embodiments of the present application, other embodiments which can be obtained by a skilled in the art without creative efforts fall into the protected scope of the of the present application. In addition, it should be understood that specific implementations described here are only used to illustrate and explain the present application and are not used to limit the present application. In the present application, if no explanation is made to the contrary, orientation words such as "upper" and "lower" usually refer to upper and lower directions of a device in an actual use or a working state and specifically refer to drawing directions in drawings. Also, "inner" and "outer" refer to an outline of the device.

Figure 1:
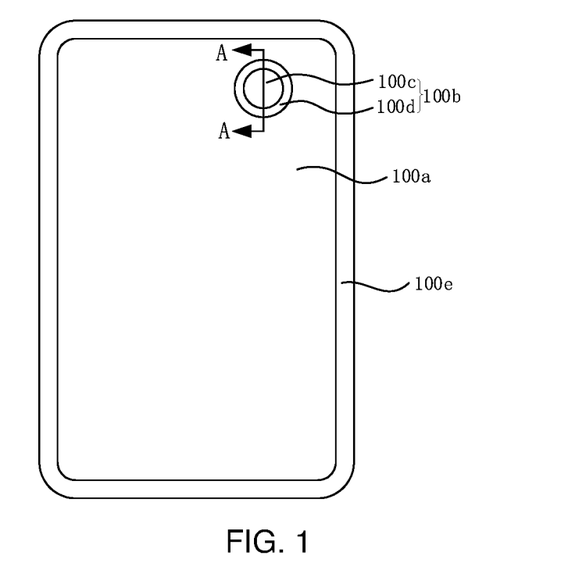
FIG. 1 is a plane view of a structural schematic diagram of a display panel provided by an embodiment of the present application.

Please refer to FIG. 1, which is a plane view of a structural schematic diagram of a display panel provided by an embodiment of the present application. The present application provides a display panel. The display panel includes a main display region 100a and at least one function adding region 100b. The function adding region 100b is configured to accommodate a transmitting sensor and a receiving sensor of an optical sensing unit. Light emitted by the transmitting sensor is received by the receiving sensor after being reflected by an external object. The function adding region 100b includes at least one light-transmitting display region 100c and a transition display region 100d positioned on a periphery of the light-transmitting display region 100c.

There can be one or more of the function adding regions 100b. For example, when there is one function adding region 100b, the transmitting sensor and the receiving sensor correspond to the function adding region 100b, and the transmitting sensor and the receiving sensor have a certain distance. For another example, when there are multiple function adding regions 100b, the transmitting sensor and the receiving sensor can correspond to a same function adding region 100b, and the transmitting sensor and the receiving sensor have a certain distance, or the transmitting sensor and the receiving sensor can also correspond to two different function adding regions 100b.

Please refer to FIGS. 2A-2D. FIGS. 2A-2D are cross-sectional structural schematic diagrams of the display panel in FIG. 1 cut along line A-A. The display panel includes a substrate 1, a plurality of pixel driving circuits 2, and a light-shielding layer 3. The pixel driving circuits 2 are disposed on the substrate 1 of the transition display region 100d. Each of the pixel driving circuits 2 includes a plurality of transistors 21. Each of the transistors 21 includes an active layer 210 and a first electrode layer 211 disposed on the active layer. An orthographic projection of the active layer 210 on the substrate 1 and an orthographic projection of the first electrode layer 211 on the substrate 1 have an overlapping portion 2101. The first electrode layer 211 is a gate of a transistor 21. The overlapping portion 2101 is a channel of the transistor 21.

It should be explained that the pixel driving circuits 2 include a plurality of first pixel driving circuits 201 and a plurality of second pixel driving circuits 202. The first pixel driving circuits 201 are configured to drive pixels in the light-transmitting display region 100c to emit light. The second pixel driving circuits 202 are configured to drive pixels in the transition display region 100d to emit light.

The light-transmitting display region 100c is not provided with the first pixel driving circuits 201. Instead, the first pixel driving circuits 201 are provided in the transition display region 100d. In addition, the first pixel driving circuits 201 and the second pixel driving circuits 202 are arranged in a concentrated distribution in an island shape, so that the light-transmitting display region 100c has a light transmittance higher than light transmittances of the main display region 100a and the transition display region 100d. The transmitting sensor and the receiving sensor correspond to the light-transmitting display region 100c. The transmitting sensor and the receiving sensor are disposed on a side of the substrate 1 away from the pixel driving circuits 2. Infrared light emitted by the transmitting sensor is likely to diverge to the transition display region 100d, which causes interference to the transistors 21 positioned in the transition display region 100d. This affects a normal operation of the first pixel driving circuits 201 and the second pixel driving circuits 202, and further affects a normal light emission of the pixels of the function adding region 100b, thereby causing a screen corresponding to the function adding region 100b to flicker. As a result, a display effect of the function adding region 100b is reduced.

In view of this, in an embodiment of the present application, the light-shielding layer 3 is positioned in the transition display region 100d of the display panel, the light-shielding layer 3 is disposed between the substrate 1 and the active layer 210 of each of the transistors 21 of the pixel driving circuits 2, and an orthographic projection of the light-shielding layer 3 on the substrate 1 covers an orthographic projection of the overlapping portion 2101 on the substrate 1. Furthermore, the light-shielding layer 3 is made of an opaque material, which has excellent opacity to shield the infrared light emitted by the transmitting sensor of the optical sensing unit. In this way, the interference of the infrared light on the transistors 21 is shielded, thereby preventing the screen corresponding to the function adding region 100b from flickering, which is beneficial to increase the display effect of the function adding region 100b.

Specifically, a material of the light-shielding layer 3 is one or a combination of titanium (Ti), aluminum (Al), and molybdenum (Mo) alloys. In an embodiment of the present application, the material of the light-shielding layer 3 is Mo alloy.

Specifically, in order to enable the light-shielding layer 3 to effectively block most of the infrared light, a thickness of the light-shielding layer 3 should not be too thin. In an embodiment of the present application, a size of the light-shielding layer 3 in a thickness direction of the display panel is greater than or equal to 100 nanometers. For example, the size of the light-shielding layer 3 in the thickness direction of the display panel may be one of 100 nanometers, 120 nanometers, or 150 nanometers.

The substrate 1 includes a rigid substrate and a flexible substrate. A preparation material of the substrate 1 includes glass, quartz, ceramic, plastic, or polymer resin, etc. The polymer resin includes at least one of polyethersulfone, polyacrylate, polyarylate, polyetherimide, polyethylene naphthalate, polyethylene terephthalate, polyphenylene sulfide, polyallyl ester, polyimide, polycarbonate, cellulose triacetate, and cellulose acetate propionate.

The transistors 21 include at least one of oxide transistors and silicon transistors. The transistors 21 include field effect transistors. Furthermore, the transistors 21 include thin-film transistors. It can be understood that structures of the transistors 21 are not limited to double gate structures shown in FIGS. 2A-2D. Those skilled in the art can further choose other structural forms, such as single-gate structures, etc., which will not be repeated herein.

The light-shielding layer 3 can be disposed on an entire surface. For example, the orthographic projection of the light-shielding layer 3 on the substrate coincides with the transition display region 100d. The light-shielding layer 3 can further be arranged in segments. When the light-shielding layer 3 is arranged in segments, it should be ensured that the orthographic projection of the light-shielding layer 3 on the substrate 1 covers the orthographic projection of the overlapping portion 2101 on the substrate 1, to shield most of the infrared light emitted by the transmitting sensor of the optical sensing unit. In this way, the interference of the infrared light on the transistors 21 is shielded, thereby preventing the function adding region 100b from flickering, which is beneficial to increase the display effect of the function adding region 100b.

Specifically, when the light-shielding layer 3 is arranged in segments, the light-shielding layer 3 includes a plurality of light-shielding portions 31 arranged at intervals. The light-shielding portions 31 one-to-one correspond to a plurality of the overlapping portions 2101. An orthographic projection of each of the light-shielding portions 31 on the substrate 1 covers an orthographic projection of a corresponding one of the overlapping portions 2101 on the substrate 1.

Figure 2A:
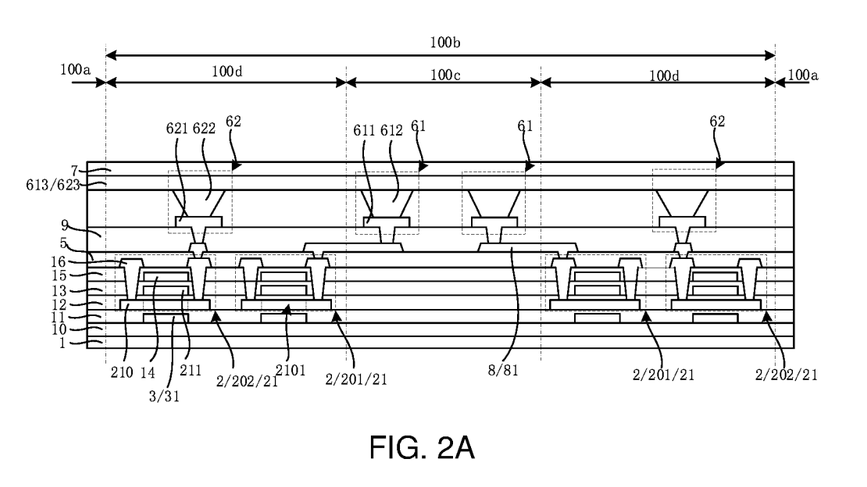
FIGS. 2A-2D are cross-sectional structural schematic diagrams of the display panel in FIG. 1 cut along line A-A.

In an embodiment, referring to FIG. 2A, an orthographic projection of one of the light-shielding portions 31 on the substrate 1 coincides with the orthographic projection of the first electrode layer 211 on the substrate 1. A planar shape of the one of the light-shielding portions 31 can be same as a planar shape of the first electrode layer 211. In this case, an area of each of the light-shielding portions 31 is the smallest, which is conducive to saving costs.

Figures 2B, 2C:
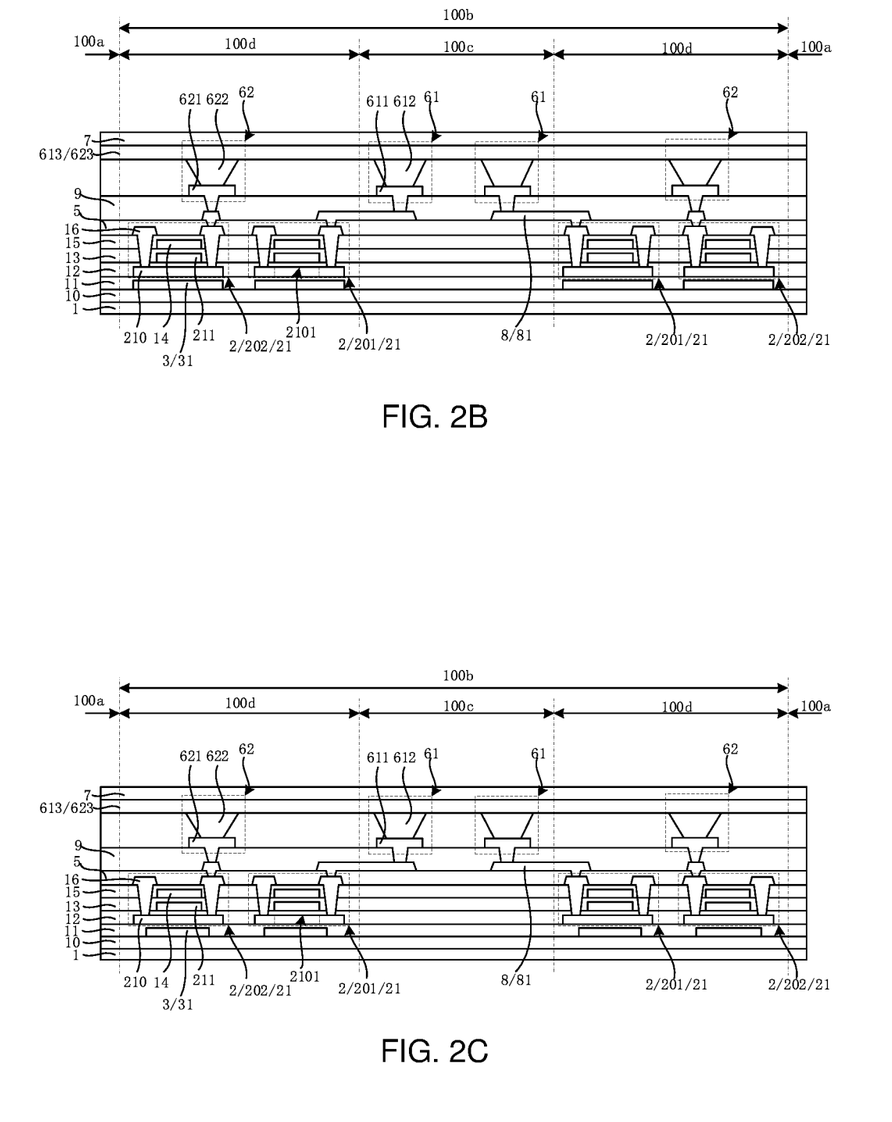

In an embodiment, referring to FIG. 2B, in order to ensure that the light-shielding portions 31 can block all the infrared light, each of the light-shielding portions 31 have a larger size along a direction parallel to the display panel. However, if the size of each of the light-shielding portions 31 in the direction parallel to the display panel is too large, such as exceeding a size of the transistor 21, which reduces the light transmittance of the transition display region 100d. Therefore, on one hand, in order to enable the light-shielding portions 31 to block all the infrared light from interfering the transistors 21, on the other hand, in order to prevent a decrease of the light transmittance of the transition display region 100d, the orthographic projection of the one of the light-shielding portions 31 on the substrate 1 coincides with the orthographic projection of the active layer 210 on the substrate 1, and the planar shape of the one of the light-shielding portions 31 can be same as a planar shape of the active layer 210.

In one embodiment, referring to FIG. 2C, the orthographic projection of the one of the light-shielding portions 31 on the substrate 1 is positioned between the orthographic projection of the first electrode layer 211 on the substrate 1 and the orthographic projection of the active layer 210 on the substrate 1.

Figure 2D:
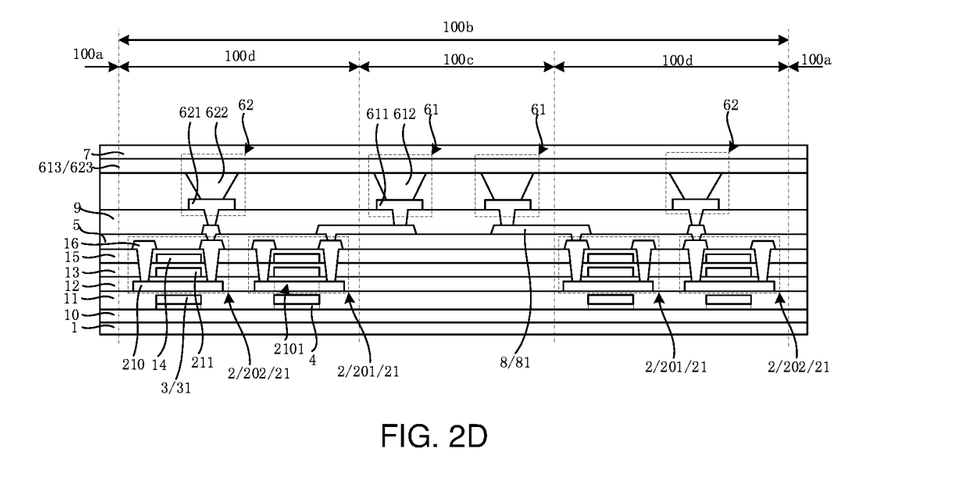

Furthermore, in an embodiment, referring to FIG. 2D, a difference between FIG. 2D and FIGS. 2A-2C is that a reflective layer 4 is disposed on a side of the light-shielding layer 3 adjacent to the substrate 1. In this way, the infrared light emitted by the transmitting sensor of the optical sensing unit undergoes specular reflection when passing through the reflective layer 4, so a propagation direction of the infrared light changes. This further reduces an amount of infrared light entering the transistors 21 and reduces the interference of the infrared light on the transistors 21, which is beneficial to increase the display effect of the function adding region 100b.

Specifically, the reflective layer 4 can adopt any one of reflective white materials such as Al, Ag, Mo, etc.

It should be explained that the pixel driving circuits 2 can be any one of 2T1C circuits, 4T1C circuits, or 7T1C circuits. Circuit structure adopted by the first pixel driving circuits 201 can be same as circuit structures adopted by the second pixel driving circuits 202. In order to clearly describe technical solutions of the present application, an embodiment of the present application takes the pixel driving circuits 2 adopting 7T1C circuits as an example for description.

Figure 3:
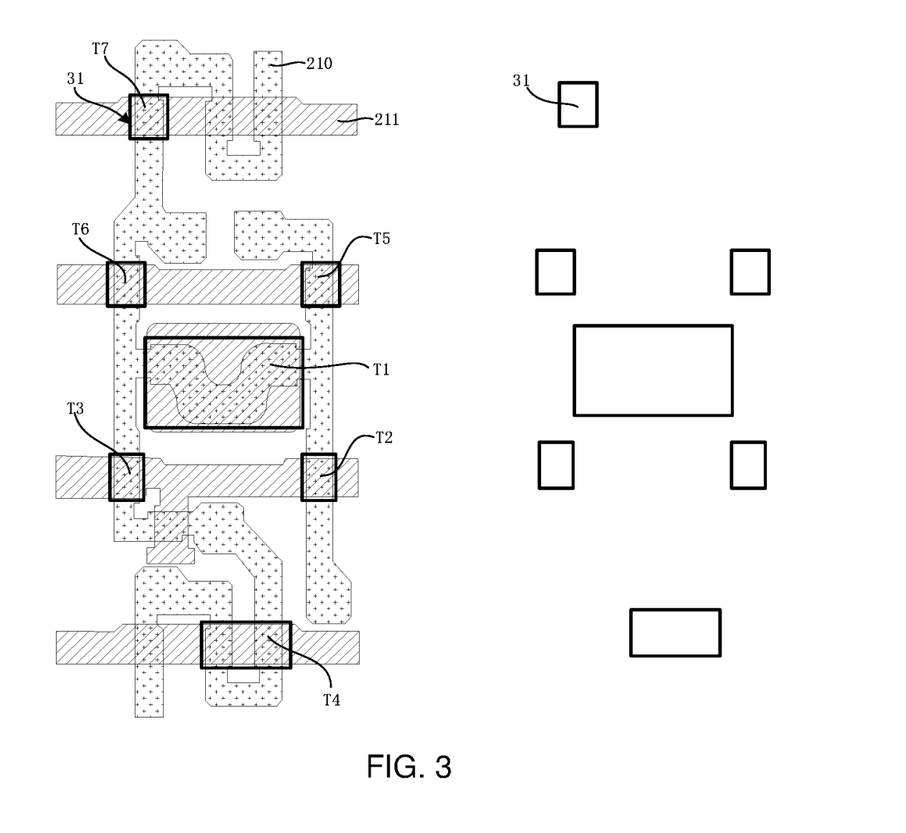
FIG. 3 is a schematic diagram of a positional relationship between pixel driving circuits and light-shielding portions provided by an embodiment of the present application.

Please refer to FIG. 3, which is a schematic diagram of a positional relationship between the pixel driving circuits and the light-shielding portions provided by an embodiment of the present application. One of the pixel driving circuits 2 includes seven transistors 21 and one storage capacitor (not shown). Specifically, the seven transistors 21 include a first transistor T1, a second transistor T2, a third transistor T3, a fourth transistor T4, a fifth transistor T5, a sixth transistor T6, and a seventh transistor T7. A channel of each of the transistors 21 is a region of the overlapping portion 2101 formed between the first electrode layer 211 and the active layer 210.

The light-shielding layer 3 is disposed on a side of each of the transistors 21 adjacent to the substrate 1, the light-shielding layer 3 includes the light-shielding portions 31, the orthographic projection of the light-shielding portions 31 on the substrate 1 completely covers the orthographic projection of the overlapping portions 2101 on the substrate 1. In this way, the interference of the infrared light on the transistors 21 is effectively shielded, thereby preventing the function adding region 100b from flickering, which is beneficial to increase the display effect of the function adding region 100b.

The light-shielding portions 31 can be independently arranged and not connected to their surrounding metal layer, or the light-shielding portions 31 can further be connected to their surrounding metal layer, and the application is not limited thereto.

Figure 4:
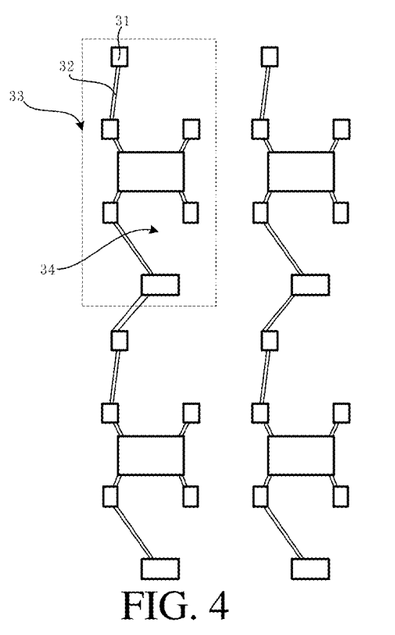
FIG. 4 is a structural schematic diagram of a metal grid provided by an embodiment of the present application.

Please refer to FIG. 4, which is a structural schematic diagram of a metal grid provided by an embodiment of the present application. The light-shielding portions 31 are connected to their surrounding metal layer. Specifically, the light-shielding layer 3 further includes a plurality of connecting portions 32. Every two adjacent light-shielding portions 31 of the light-shielding portions 31 are connected by one of the connecting portions 32 to form a metal grid. The metal grid is divided by a plurality of hollow portions 34 located between the light-shading portions 31 and the connecting portions 32. The hollow portions 34 are regions where the light-shielding layer 3 is not provided and are located between the light-shielding portions 31 of a single one of the pixel driving circuits 2.

Figure 5A:
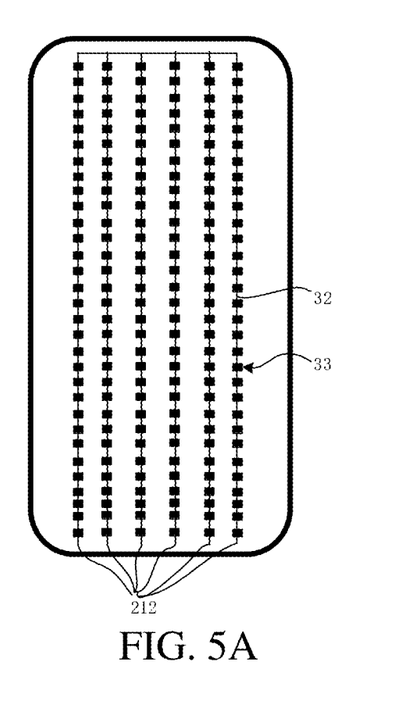
FIG. 5A is a schematic diagram of a connection between the metal grid and bias voltage signal lines.
Figure 5B:
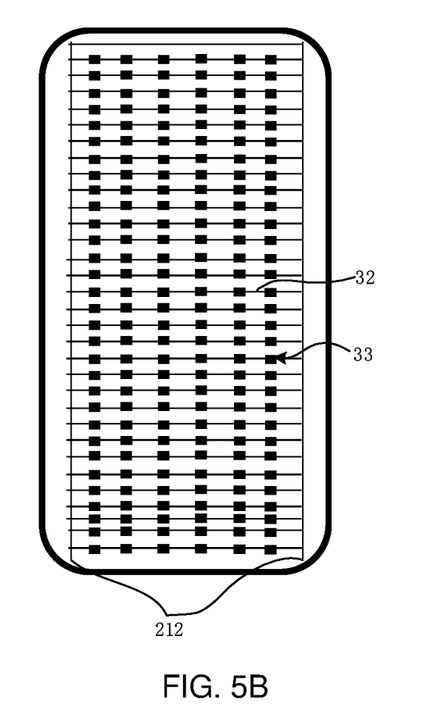
FIG. 5B is another schematic diagram of a connection between the metal grid and the bias voltage signal lines.

Please further referring to FIG. 4 and FIGS. 5A-5B. FIG. 5A is a schematic diagram of a connection between the metal grid and bias voltage signal lines. FIG. 5B is another schematic diagram of a connection between the metal grid and the bias voltage signal lines.

The display panel further includes a non-display region 100e positioned on a periphery of the main display region 100a. The substrate 1 of the non-display region 100e is provided with a bias voltage signal line 212. The metal grid is electrically connected to the bias voltage signal line 212 to prevent electrostatic discharge (ESD) caused by an accumulation of large-area metal charges due to a coupling between the first electrode layer 211 and the light-shielding portions 31.

Specifically, the bias voltage signal line 212 can be a power signal line, such as a low-potential signal line VSS.

The light-shielding portions 31 corresponding to each of the pixel driving circuits 2 constitute a repeat unit 33 of the light-shielding layer 3. The light-shielding layer 3 includes a plurality of the repeat units 33 distributed in an array. Two adjacent repeat units 33 are connected by one of the connecting portions 32. Specifically, two adjacent repeat units 33 in a same column are connected by one of the connecting portions 32, or two adjacent repeat units 33 in a same row are connected by one of the connecting portions 32.

In an embodiment, as shown in FIG. 5A, two adjacent repeat units 33 positioned in a same column are connected by one of the connecting portions 32. The bias voltage signal line 212 is disposed on upper and lower borders of the display panel. Each column of the repeat units 33 can be connected to different bias voltage signal lines 212, or multiple columns of the repeat units 33 can be connected to a same bias voltage signal line 212.

In an embodiment, as shown in FIG. 5B, two adjacent repeat units 33 positioned in a same row are connected by one of the connecting portions 32. The bias voltage signal line 212 is disposed on left and right borders of the display panel. Each row of the repeat units 33 can be connected to different bias voltage signal lines 212, or multiple rows of the repeat units 33 can be connected to a same bias voltage signal line 212.

Furthermore, referring to FIGS. 2A-2D again, the display panel further includes a planarization layer 5, first light-emitting devices 61, second light-emitting devices 62, and an encapsulating layer 7. The planarization layer covers the pixel driving circuits 2. The first light-emitting devices 61 and the second light-emitting devices 62 are disposed on a side of the planarization layer 5 away from the substrate 1.

The encapsulating layer 7 covers the first light-emitting devices 61 and the second light-emitting devices 62. The encapsulating layer 7 can adopt thin-film encapsulation.

The first light-emitting devices 61 and the second light-emitting devices 62 are disposed on the side of the planarization layer 5 away from the substrate 1. The first light-emitting devices 61 are positioned in the light-transmitting display region 100c. The second light-emitting devices 62 are positioned in the transition display region 100d. The first pixel driving circuits 201 are electrically connected to the first light-emitting devices 61 to drive the first light-emitting devices 61 to emit light. The second pixel driving circuits 202 are electrically connected to the second light-emitting devices 62 to drive the second light-emitting devices 62 to emit light.

Specifically, each of the first light-emitting devices 61 includes a first anode 611, a first light-emitting layer 612, and a first cathode 613. The first cathode 61 is disposed on a side of the first anode 611 away from the planarization layer 5. The first light-emitting layer 612 is disposed between the first anode 611 and the first cathode 613. Each of the second light-emitting devices 62 includes a second anode 621, a second light-emitting layer 622, and a second cathode 623. The second cathode 623 is disposed on a side of the second anode 621 away from the planarization layer 5. The second light-emitting layer 622 is disposed between the second anode 621 and the second cathode 623.

Furthermore, a transparent conductive layer 8 is further provided between one of the first light-emitting devices 61, one of the second light-emitting devices 62, and one of the pixel driving circuits 2. The transparent conductive layer 8 includes at least one layer of a connecting wire 81. Preferably, the transparent conductive layer 8 includes multiple layers of the connecting wires 81. A wiring insulating layer 9 is provided between the connecting wires 81 in different layers. The wiring insulating layer 9 adopts an insulating material. The connecting wires 81 are electrically connected through through-holes on the wiring insulating layer 9 to reduce wiring density. The interconnecting connecting wires 81 extend from the transition display region 100d to the light-transmitting display region 100c to realize electrical connections between the first pixel driving circuits 201 and the first light-emitting devices 61.

Furthermore, the display panel further includes a buffer layer 10, a first insulating layer 11, a second insulating layer 12, a third insulating layer 13, a second electrode layer 14, a fourth insulating layer 15, and a source/drain metal layer 16. The buffer layer 10 is disposed between the substrate 1 and the light-shielding layer 3. The first insulating layer 11 covers the buffer layer 10 and the light-shielding layer 3. The active layer 210 is disposed on a side of the first insulating layer 11 away from the substrate 1. The second insulating layer 12 covers the first insulating layer 11 and the active layer 210. The first electrode layer 211 is disposed on a side of the first insulating layer 11 away from the substrate 1. The third insulating layer 13 covers the second insulating layer 12 and the first electrode layer 211. The second electrode layer 14 is disposed on the third insulating layer 13. The fourth insulating layer 15 covers the third insulating layer 13 and the second electrode layer 14. The source/drain metal layer 16 is disposed on the fourth insulating layer 15. The source/drain metal layer 16 includes a source and a drain. The source and the drain are respectively connected to the active layer 210 through a first through-hole and a second through-hole penetrating the second insulating layer 12, the third insulating layer 13, and the fourth insulating layer 15.

Specifically, the buffer layer 10 can be made of a material including silicon, nitrogen, and oxygen. The first insulating layer 11, the second insulating layer 12, the third insulating layer 13, and the fourth insulating layer 15 are made of silicon oxide, silicon nitride, silicon oxynitride, etc. The first electrode layer 211, the second electrode layer 14, and the source/drain metal layer 16 can be metals or alloys including copper, titanium, molybdenum, and other metals with excellent electrical conductivity.

The present application further provides a display device, including the display panel and the optical sensing unit in the above embodiments. The display device includes a fixed terminal such as a TV and a desktop computer, a mobile terminal such as a mobile phone and a notebook computer, and wearable devices such as a bracelet, a virtual reality (VR) display device, and an augmented reality (AR) display device.

The optical sensing unit is disposed on a side of the display panel. The optical sensing unit includes the transmitting sensor and the receiving sensor. The transmitting sensor and the receiving sensor correspond to the function adding region 100b. Light emitted by the transmitting sensor is reflected and received by the receiving sensor, so that the display device realizes under-screen fingerprint recognition, under-screen camera, under-screen recognition, under-screen distance sensing, and other under-screen sensing solutions. The optical sensing unit can be a TOF camera.

Beneficial effects of the present application are as follows. In the display panel and the display device provided by the present application, a layer of the light-shielding layer is positioned in the transition display region of the display panel, the light-shielding layer is disposed between the substrate and the active layer of each of the transistors of the pixel driving circuits, the orthographic projection of the active layer on the substrate and the orthographic projection of the first electrode layer on the substrate includes the overlapping portion, and the orthographic projection of the light-shielding portions on the substrate covers the orthographic projection of the overlapping portions on the substrate. Therefore, the light-shielding layer can effectively shield infrared light emitted by the transmitting sensor of the optical sensing unit, which prevents devices of the transistors in the transition display region from an interference of the infrared light, thereby preventing under-screen camera regions from flickering.

Although the present application has been disclosed above with the preferred embodiments, it is not intended to limit the present application. Persons having ordinary skill in this technical field can still make various alterations and modifications without departing from the scope and spirit of this application. Therefore, the scope of the present application should be defined and protected by the following claims and their equivalents.

What is claimed is:

1. A display panel, comprising:
   a main display region;
   at least one function adding region configured to accommodate a transmitting sensor and a receiving sensor of an optical sensing unit, wherein the function adding region comprises at least one light-transmitting display region and a transition display region positioned on a periphery of the light-transmitting display region;
   a substrate;
   a plurality of pixel driving circuits disposed on the substrate and positioned in the transition display region, wherein each of the pixel driving circuits comprises a plurality of transistors, each of the transistors comprises an active layer and a first electrode layer disposed on the active layer, and an orthographic projection of the active layer on the substrate and an orthographic projection of the first electrode layer on the substrate comprises an overlapping portion; and
   a light-shielding layer disposed between the substrate and the pixel driving circuits and positioned in the transition display region, wherein an orthographic projection of the light-shielding layer on the substrate covers an orthographic projection of the overlapping portion on the substrate, a size of the light-shielding layer on a thickness direction of the display panel is greater than or equal to 100 nanometers, and a material of the light-shielding layer comprises one or a combination of titanium (Ti), aluminum (Al), and molybdenum (Mo) alloys;
   wherein the light-shielding layer comprises a plurality of light-shielding portions arranged at intervals, the light-shielding portions one-to-one correspond to a plurality of the overlapping portions, and an orthographic projection of each of the light-shielding portions on the substrate covers an orthographic projection of a corresponding one of the overlapping portions on the substrate; and
   wherein the light-shielding layer further comprises a plurality of connecting portions, in each of the pixel driving eireuit circuits, every two adjacent light-shielding portions are connected by one of the connecting portions to form a metal grid, the metal grid is divided by a plurality of hollow portions located between the light-shielding portions and the connecting portions, and the hollow portions are regions where the light-shielding layer is not provided and are located between the light-shielding portions of a single one of the pixel driving circuits.

2. The display panel according to claim 1, wherein an orthographic projection of one of the light-shielding portions on the substrate coincides with an orthographic projection of a corresponding first electrode layer on the substrate.

3. The display panel according to claim 1, wherein an orthographic projection of one of the light-shielding portions on the substrate coincides with an orthographic projection of a corresponding active layer on the substrate.

4. The display panel according to claim 1, wherein the display panel further comprises a non-display region on a periphery of the main display region, the substrate in the non-display region is provided with a bias voltage signal line, and the metal grid is electrically connected to the bias voltage signal line.

5. The display panel according to claim 1, wherein a side of the light-shielding layer adjacent to the substrate is provided with a reflective layer.

6. The display panel according to claim 1, wherein the display panel further comprises first light-emitting devices and second light-emitting devices, the first light-emitting devices are positioned in the light-transmitting display region, and the second light-emitting devices are positioned in the transition display region; and
   the pixel driving circuits comprises a plurality of first pixel driving circuits and a plurality of second pixel driving circuits, the first pixel driving circuits are electrically connected to the first light-emitting devices to drive the first light-emitting devices to emit light, and the second pixel driving circuits are electrically connected to the second light-emitting devices to drive the second light-emitting devices to emit light.

7. A display panel, comprising
a main display region;
at least one function adding region configured to accommodate a transmitting sensor and a receiving sensor of an optical sensing unit, wherein the function adding region comprises at least one light-transmitting display region and a transition display region positioned on a periphery of the light-transmitting display region;
a substrate;
a plurality of pixel driving circuits disposed on the substrate and positioned in the transition display region, wherein each of the pixel driving circuits comprises a plurality of transistors, each of the transistors comprises an active layer and a first electrode layer disposed on the active layer, and an orthographic projection of the active layer on the substrate and an orthographic projection of the first electrode layer on the substrate comprises an overlapping portion; and
a light-shielding layer disposed between the substrate and the pixel driving circuits and positioned in the transition display region, wherein an orthographic projection of the light-shielding layer on the substrate covers an orthographic projection of the overlapping portion on the substrate;
wherein the light-shielding layer comprises a plurality of light-shielding portions arranged at intervals, the light-shielding portions one-to-one correspond to a plurality of the overlapping portions, and an orthographic projection of each of the light-shielding portions on the substrate covers an orthographic projection of a corresponding one of the overlapping portions on the substrate; and
wherein the light-shielding layer further comprises a plurality of connecting portions, in each of the pixel driving circuits, every two adjacent light-shielding portions are connected by one of the connecting portions to form a metal grid, the metal grid is divided by a plurality of hollow portions located between the light-shielding portions and the connecting portions, and the hollow portions are regions where the light-shielding layer is not provided and are located between the light-shielding portions of a single one of the pixel driving circuits.

8. The display panel according to claim 7, wherein an orthographic projection of one of the light-shielding portions on the substrate coincides with an orthographic projection of a corresponding first electrode layer on the substrate.

9. The display panel according to claim 7, wherein an orthographic projection of one of the light-shielding portions on the substrate coincides with an orthographic projection of a corresponding active layer on the substrate.

10. The display panel according to claim 7, wherein the display panel further comprises a non-display region on a periphery of the main display region, the substrate in the non-display region is provided with a bias voltage signal line, and the metal grid is electrically connected to the bias voltage signal line.

11. The display panel according to claim 7, wherein a side of the light-shielding layer adjacent to the substrate is provided with a reflective layer.

12. The display panel according to claim 7, wherein a size of the light-shielding layer on a thickness direction of the display panel is greater than or equal to 100 nanometers.

13. The display panel according to claim 7, wherein a material of the light-shielding layer comprises one or a combination of titanium (Ti), aluminum (Al), and molybdenum (Mo) alloys.

14. The display panel according to claim 7, wherein the display panel further comprises first light-emitting devices and second light-emitting devices, the first light-emitting devices are positioned in the light-transmitting display region, and the second light-emitting devices are positioned in the transition display region; and
the pixel driving circuits comprises a plurality of first pixel driving circuits and a plurality of second pixel driving circuits, the first pixel driving circuits are electrically connected to the first light-emitting devices to drive the first light-emitting devices to emit light, and the second pixel driving circuits are electrically connected to the second light-emitting devices to drive the second light-emitting devices to emit light.

15. The display panel according to claim 7, wherein each of the transistors further comprises:
a buffer layer disposed between the substrate and the light-shielding layer;
a first insulating layer covering the buffer layer and the light-shielding layer, wherein the active layer is disposed on a side of the first insulating layer away from the substrate;
a second insulating layer covering the first insulating layer and the active layer, wherein the first electrode layer is disposed on the side of the first insulating layer away from the substrate;
a third insulating layer covering the second insulating layer and the first electrode layer;
a second electrode layer disposed on the third insulating layer;
a fourth insulating layer covering the third insulating layer and the second electrode layer; and
a source/drain metal layer disposed on the fourth insulating layer and comprising a source and a drain, wherein the source and the drain are respectively connected to the active layer through through-holes penetrating the second insulating layer, the third insulating layer, and the fourth insulating layer.

16. A display device, comprising a display panel, wherein the display panel comprises:
a main display region;
at least one function adding region configured to accommodate a transmitting sensor and a receiving sensor of an optical sensing unit, wherein the function adding region comprises at least one light-transmitting display region and a transition display region positioned on a periphery of the light-transmitting display region;
a substrate;
a plurality of pixel driving circuits disposed on the substrate and positioned in the transition display region, wherein each of the pixel driving circuits comprises a plurality of transistors, each of the transistors comprises an active layer and a first electrode layer disposed on the active layer, and an orthographic projection of the active layer on the substrate and an orthographic projection of the first electrode layer on the substrate comprises an overlapping portion;
a light-shielding layer disposed between the substrate and the pixel driving circuits and positioned in the transition display region, wherein an orthographic projection of the light-shielding layer on the substrate covers an orthographic projection of the overlapping portion on the substrate; and
the optical sensing unit disposed on a side of the display panel and comprising the transmitting sensor and the receiving sensor, wherein transmitting sensor and the receiving sensor are correspond to the function adding region, and light emitted by the transmitting sensor is received by the receiving sensor after being reflected;

wherein the light-shielding layer comprises a plurality of light-shielding portions arranged at intervals, the light-shielding portions one-to-one correspond to a plurality of the overlapping portions, and an orthographic projection of each of the light-shielding portions on the substrate covers an orthographic projection of a corresponding one of the overlapping portions on the substrate; and wherein the light-shielding layer further comprises a plurality of connecting portions, in each of the pixel driving circuits, every two adjacent light-shielding portions are connected by one of the connecting portions to form a metal grid, the metal grid is divided by a plurality of hollow portions located between the light-shielding portions and the connecting portions, and the hollow portions are regions where the light-shielding layer is not provided and are located between the light-shielding portions of a single one of the pixel driving circuits.

* * * * *